(12) United States Patent
Kim et al.

(10) Patent No.: US 6,649,503 B2
(45) Date of Patent: Nov. 18, 2003

(54) METHODS OF FABRICATING INTEGRATED CIRCUIT DEVICES HAVING SPIN ON GLASS (SOG) INSULATING LAYERS AND INTEGRATED CIRCUIT DEVICES FABRICATED THEREBY

(75) Inventors: Won-Jin Kim, Kyunggi-do (KR); Jin-Gi Hong, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 41 days.

(21) Appl. No.: 09/999,624

(22) Filed: Oct. 30, 2001

(65) Prior Publication Data

US 2002/0064968 A1 May 30, 2002

(30) Foreign Application Priority Data

Nov. 30, 2000 (KR) .......................................... 2000-72090

(51) Int. Cl.[7] .......................................... H01L 21/3205
(52) U.S. Cl. ...................... 438/595; 438/782; 438/622; 438/639
(58) Field of Search .................. 438/782, 587, 438/595, 618, 622, 639

(56) References Cited

U.S. PATENT DOCUMENTS

| | | | | |
|---|---|---|---|---|
| 5,219,792 A | * | 6/1993 | Kim et al. | 438/631 |
| 5,702,568 A | * | 12/1997 | Shin et al. | 438/632 |
| 5,759,906 A | * | 6/1998 | Lou | 438/623 |
| 6,287,957 B1 | * | 9/2001 | Linliu | 438/634 |

FOREIGN PATENT DOCUMENTS

JP    04-326553    * 11/1992

* cited by examiner

Primary Examiner—Trung Dang
(74) Attorney, Agent, or Firm—Myers Bigel Sibley & Sajovec

(57) ABSTRACT

Methods are provided for forming integrated circuit devices. A spin on glass (SOG) insulating layer is formed on an integrated circuit substrate. The SOG insulating layer includes sidewalls that define contact holes therein and spacers are formed on the sidewalls of the SOG insulating layer. Integrated circuit devices are also provided. The integrated circuit devices include an integrated circuit substrate, a spin on glass (SOG) insulating layer on the integrated circuit substrate. The SOG insulating layer includes sidewalls that define contact holes therein and spacers are provided on sidewalls of the SOG insulating layer.

25 Claims, 7 Drawing Sheets

METHODS OF FABRICATING INTEGRATED CIRCUIT DEVICES HAVING SPIN ON GLASS (SOG) INSULATING LAYERS AND INTEGRATED CIRCUIT DEVICES FABRICATED THEREBY

RELATED APPLICATION

This application is related to Korean Application No. 2000-72090, filed Nov. 30, 2000, the disclosure of which is hereby incorporated herein by reference.

FIELD OF THE INVENTION

The present invention relates to integrated circuit devices and methods of fabricating the same and, more particularly, to integrated circuit devices having spin on glass (SOG) insulating layers and methods of fabricating the same.

BACKGROUND OF THE INVENTION

As integrated circuit devices become more compact, the size of the elements within these devices gradually decrease and the devices tend to have more layers. The quantity of layers may cause problems in the integrated circuit device. For example, the aspect ratio of a contact hole may increase, via holes may penetrate a given region between the wires and/or the elements, the step coverage may be increased and the like. When the aspect ratio of the contact holes increase, it may become more difficult to form deep and narrow holes in certain layers of the device and to fill the narrow holes with conductive material to interconnect certain layers. Furthermore, a bad step coverage at the lower part of the device may result in a problem when the upper part of the device is patterned by means of a photolithography process to form the wires and/or the elements. Recently, a technique using an insulating layer has been developed that can reduce the frequency of these problems. For example, a method of utilizing this technique may include the steps of filling in gaps between the elements such as gate lines of the field effect transistor with an insulating layer, forming contact holes and pads in the insulating layer and planarizing the upper part of the insulating layer.

For example, a method of forming an insulating layer has been proposed including the steps of forming a borophospho silicate glass (BPSG) insulating layer and heating the BPSG layer at a high temperature of about 830° C. In highly integrated circuit devices the width between gate lines is typically designed below a critical dimension (CD) of 0.2 μm. Thus, the high temperature heat treatment discussed above may damage the elements, for example, transistors in the integrated circuit device. Thus, another method proposed the use of an $O_3$ tetra ethyl ortho silicate undoped silicate glass ($O_3$—TEOS USG), or high density plasma (HDP) oxide layer to address the problem with respect to high temperatures. However, these layers may cause voids or seams in the integrated circuit device when the width between gate lines of the field effect transistor is designed below a CD of 0.2 μm, for example, about 0.18 μm.

Accordingly, another method using a spin on glass (SOG) layer as an insulating layer has been developed. SOG material is a good material to use to fill gaps between the gate lines and to reduce the step coverage since it also has a liquid state (spin on liquid (SOL)). Once the SOG material is applied to a substrate, the SOG material is subjected to a soft bake process at a low temperature of from about 75° C. to about 300° C. to remove solvent ingredients, such as dialkyl ether. The soft bake process may be followed by a hard bake process at a temperature of about 400° C. to obtain a finished SOG insulating layer. A curing process may also be performed by annealing the SOG material at a temperature of more than about 700° C. to remove unstable ingredients in the SOG layer and to stabilize crystallized structures therein.

However, the curing process may not completely remove all impurities, such as organic elements, hydrogen, nitrogen, inorganic elements etc., thus, the remaining impurities may remain in the SOG layer and may cause layer characteristics to deteriorate. The deterioration in layer characteristics may cause the formation of contaminants and crystallized structures in subsequent processes. Since curing begins on the surface of the SOG layer, lower parts of the SOG layers and corners between the gate lines typically contain more left over impurities.

Furthermore, if a SOG layer containing impurities is subjected to an etch process and a cleaning process, the etch rate with respect to the regions of the SOG layer containing impurities may be higher than the etch rate with respect to regions of the SOG layer that are free of impurities. Generally, crystallized structures in the SOG layer are transformed into porous crystallized structures by means of impurities.

Typically, a SOG layer that contains porous crystallized structures has a very high wet etch rate. Also, the portions of the SOG layer containing impurities may have different characteristics with respect to thermal expansion which may cause elements in the integrated circuit device to deteriorate, thus producing more devices of inferior quality.

For example, the case of an inorganic SOG insulating layer will be described.

An inorganic SOG insulating layer may comprise materials such as hydro silsesquixoxane (HSQ) or polysilazane. The SOG insulating layer may be formed after forming a metal oxide silicon (MOS) or other field effect transistor structure on a substrate. As discussed above, a porous crystallized structure portion is typically formed at the lower part of the SOG insulating layer between the gate lines. Thus, when pads for bit line contacts or storage node contacts are formed by means of a self-aligned method, for example, a self aligned contact (SAC) technique, the lower part of the SOG layer having porous crystallized structures may be exposed. The exposed lower part of the SOG layer may be easily etched using an etchant such as a mixture of $NH_4OH$, $H_2O_2$, and de-ionized water called SCl, or buffered oxide etcher (BOE). Accordingly, pipe line shaped bridges can be formed between the adjacent pads through the exposed lower part of the SOG layer. These bridges may cause short circuits between wires of the integrated circuit device, which may cause the integrated circuit device to function abnormally.

FIG. 1 and FIG. 2 are side cross-sectional views of a portion of a substrate of a conventional integrated circuit device. Now referring to FIG. 1, gate lines are formed on the substrate 10 on which is an isolation layer 11 is formed. The gate lines are formed by depositing and patterning a gate insulating layer 13, a conductive layer 15, and a silicon nitride capping layer 17 in order. On sidewalls of the gate lines, spacers 19 are formed from a silicon nitride layer. An optional liner layer (not shown) may be deposited, and a polysilazane SOG layer 21 may be formed by using a spin coating method. Thereafter, a bake and an annealing process are performed. Now referring to FIG. 2, a cross-section between gate lines of a portion of the substrate along line A–A' shown in FIG. 1 is shown. A portion of the SOG layer below the dotted line in FIG. 2 represents a portion of the SOG layer that contains impurities, i.e. a portion of the SOG layer that is incompletely cured during the annealing process.

Now referring to FIG. 3, a cross-section of the substrate of FIG. 2 on which contact holes are formed in the SOG insulating layer and filled with polysilicon material will be described. After the annealing process, contact holes 23 are formed to form storage node contact pads and bit line contact pads by means of a self-aligned method. After the contact holes 23 are formed, a cleaning process is carried out and the contact holes 23 are filled with a polysilicon layer by means of a chemical vapor deposition (CVD) method. Thereafter, a chemical-mechanical polishing (CMP) or an etch back process may be performed to divide pads. However, in the cleaning process, the SOG layer between the contact holes may be partially etched to form irregular side surfaces as shown in FIG. 3. In some situations, a portion of the SOG layer 21 may be pierced and the polysilicon layer may be deposited in the pierced portion of the SOG layer 21. This situation may cause a short circuit between the bit line contact pads and the adjacent storage node contact pads.

SUMMARY OF THE INVENTION

Embodiments of the present invention provide methods of fabricating integrated circuit devices including the steps of forming a spin on glass (SOG) insulating layer on an integrated circuit substrate, the SOG insulating layer including sidewalls that define contact holes therein and forming spacers on the sidewalls of the SOG insulating layer.

In some embodiments of the present invention forming a SOG insulating layer includes the steps of spin coating a SOG material on the surface of the substrate, baking the SOG material, and annealing the SOG material. The SOG material may include at least one of polysilazane and silsesquioxane. Baking the SOG material may include the step of baking the SOG material at a temperature of about 400° C. for several minutes. Annealing the SOG material may include the step of annealing the SOG material at a temperature of from about 350° C. to about 850° C. for from about 10 minutes to about 2 hours. Annealing the SOG material may alternatively include the step of annealing the SOG material at a temperature of about 700° C. to about 800° C.

Other embodiments of the present invention include the steps of forming a photoresist pattern on the integrated circuit substrate and dry-etching the SOG layer using the photoresist pattern as a mask in between forming the SOG insulating layer and forming the spacers.

In further embodiments of the present invention forming spacers on sidewalls of SOG insulating layer may include the steps of forming a spacer layer on the surface of the integrated circuit substrate and etching the spacer layer to form the spacers on the sidewalls of the contact holes. The spacer layer may include at least one of a high temperature oxide (HTO), a medium temperature oxide (MTO) and a silicon nitride ($Si_xN_y$). The spacer layer may have a thickness of from about 50 Å to about 400 Å. Alternatively, the spacer layer may have a thickness of from about 100 Å to about 200 Å.

Still further embodiments of the present invention may include the steps of cleaning the integrated circuit substrate and depositing a conductive material in the contact holes to form a conductive layer. Cleaning the surface of the substrate may include the step of performing a wet etch over the whole surface of the integrated circuit substrate for about 10 minutes. Performing the wet etch may include a wet cleaning process using a mixture of $NH_4OH$, $H_2O_2$ and de-ionized water (SC1). Depositing a conductive material may include forming a conductive layer using a CVD process. The conductive layer may be a polysilicon conductive layer. The method of the present invention may further include performing a CMP process to expose an upper surface of the SOG insulating layer.

Some embodiments of the present invention provide an integrated circuit device including an integrated circuit substrate, a spin on glass (SOG) insulating layer on the integrated circuit substrate, the SOG insulating layer including sidewalls that define contact holes therein and spacers on sidewalls of the SOG insulating layer.

BRIEF DESCRIPTION OF THE DRAWINGS

FIG. 4A to FIG. 8A are cross-sectional views illustrating a portion of a substrate according to embodiments of the present invention; and FIG. 4B to FIG. 8B are cross-sectional views between certain gate lines of a portion of the substrate according to embodiments of the present invention.

DETAILED DESCRIPTION OF THE INVENTION

Figure 1:
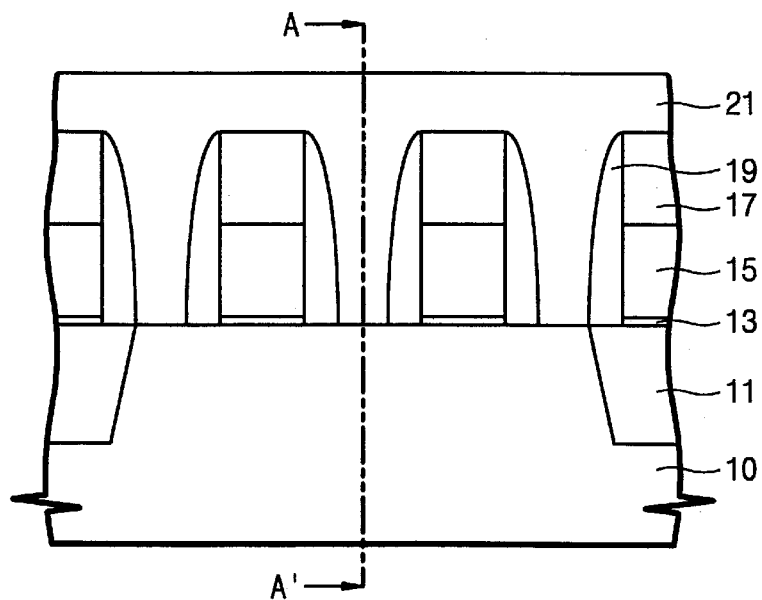
FIG. 1 and FIG. 2 are cross-sectional views of a portion of a substrate of a conventional integrated circuit device.
Figure 2:
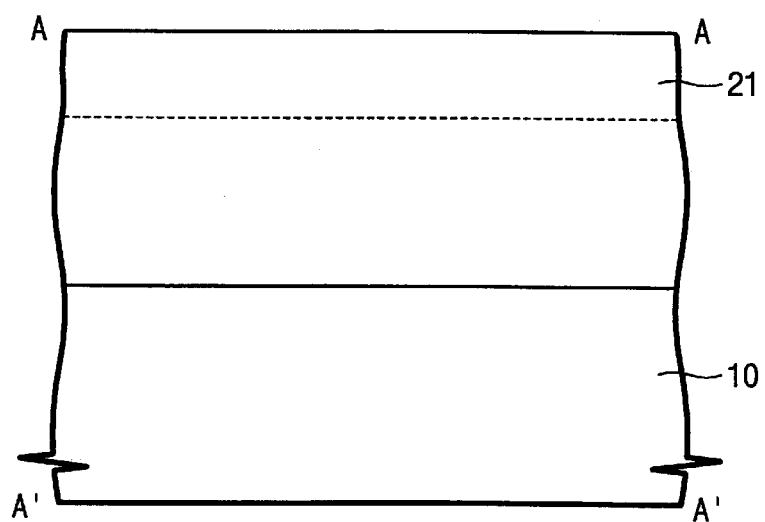
Figure 3:
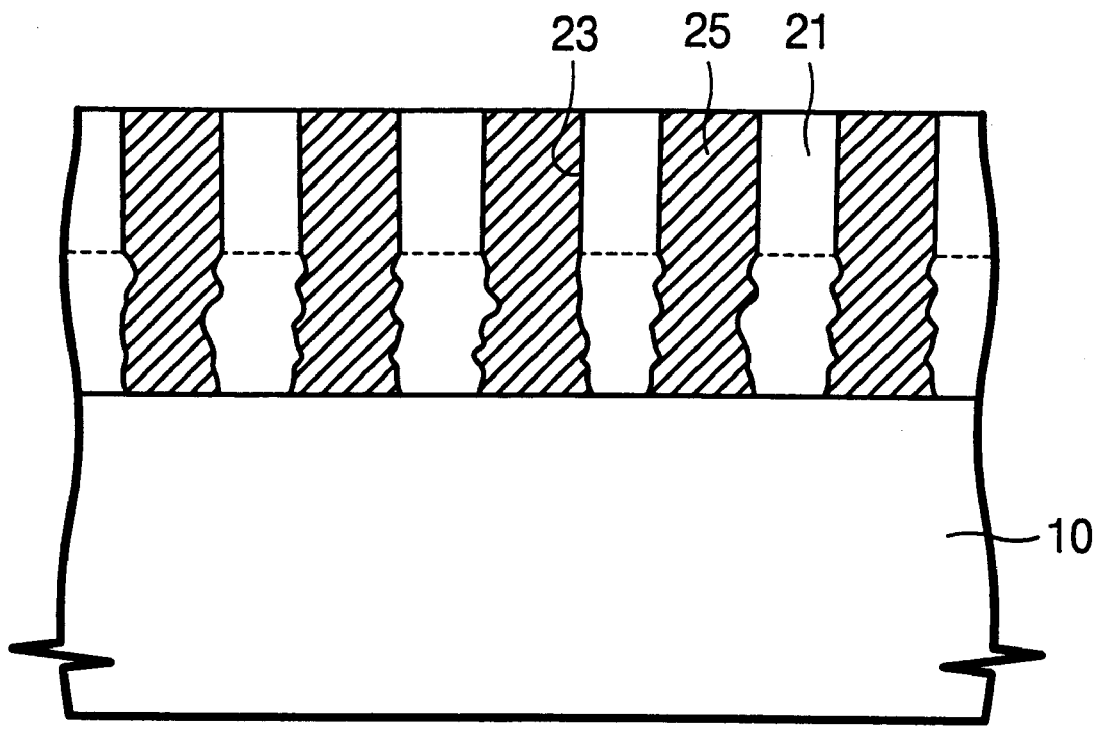
FIG. 3 is a cross-sectional view of the portion of the substrate of FIG. 2 on which the contact holes are formed in the SOG insulating layer and filled with polysilicon material.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. In contrast, when an element is referred to as being "directly on" another element, there are no intervening elements present. Like reference numerals refer to like elements throughout.

Embodiments of the present invention will now be described in detail below with reference to FIGS. 4 through 8, which illustrate various embodiments of the present invention and various processes of fabricating embodiments of the present invention. An integrated circuit device is provided on an integrated circuit substrate having a spin on glass (SOG) insulating layer. The SOG insulating layer includes sidewalls that define contact holes therein. Spacers are provided on the sidewalls of the SOG insulating layer. As described in detail below, providing the spacers on the sidewalls of the contact holes in the SOG layer may decrease the occurrence of short circuits between the pads when they are formed in the SOG insulating layer that contains impurities that cause a porous crystallized structure portion. Thus, the present invention may increase reliability of the device and reduce devices of inferior quality.

FIGS. 4 through 8 are cross-sectional views illustrating integrated circuit devices having spin on glass (SOG) insulating layers and methods of fabricating the same according to embodiments of the present invention. FIG. 4A to FIG. 8A are cross-sectional views illustrating a portion of a substrate, and FIG. 4B to FIG. 8B are cross-sectional views between certain gate lines of the portion of the substrate corresponding to the cross-sectional views shown in FIG. 4A to FIG. 8A, respectively.

Figure 4A:
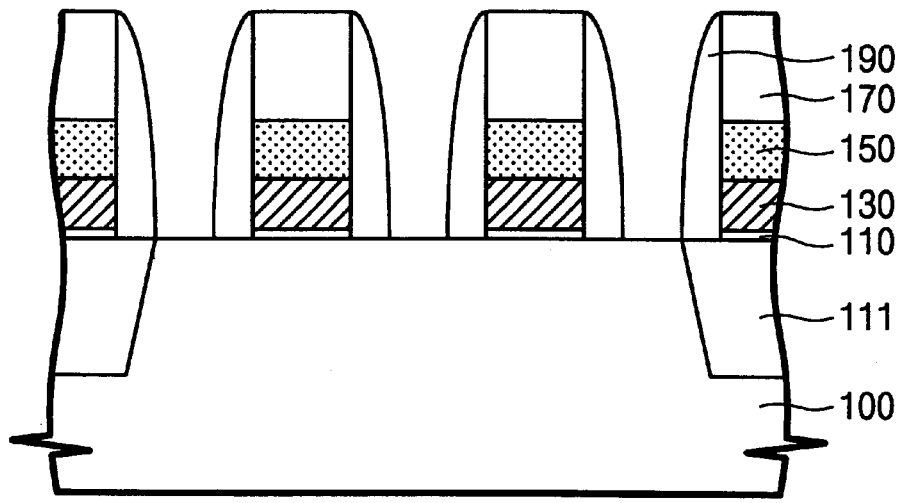
Figure 4B:
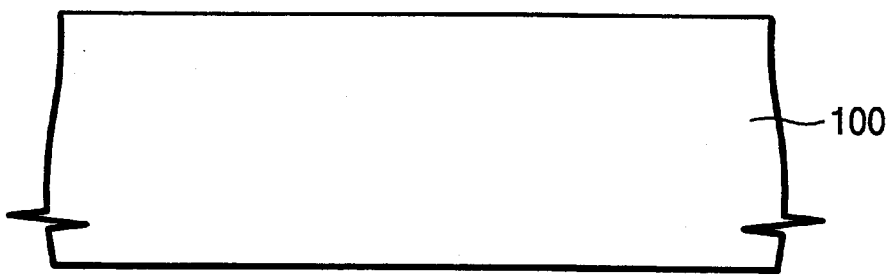

Referring now to FIG. 4A and FIG. 4B, an isolation layer 111 is formed on an integrated circuit substrate 100 to define an active region. A gate insulating layer 110 is formed on the substrate 100. A polysilicon layer 130 is formed on the gate insulating layer 110, a metal silicide layer 150 is formed on the polysilicon layer 130 and a silicon nitride capping layer 170 is formed on the metal silicide layer 150. The polysilicon layer 130 has a thickness of about 800 Å, the metal silicide layer 150 has a thickness of about 1000 Å, and the silicon nitride capping layer 170 has a thickness of about 2000 Å. These layers may be patterned to form gate lines. A conformal silicon nitride layer may be deposited to a thickness of 1000 Å. To form spacers 190 on sidewalls of the gate lines, an anisotropic etching process is performed on the whole surface of the substrate 100. Before forming of the spacers 190, an ion implantation process may be performed to form source and/or drain regions. Alternatively, after a gate pattern is formed, an oxidation process for etch curing can be carried out on the sidewalls of the gate pattern. Furthermore, after the spacers 190 are formed, a thin silicon nitride liner layer (not shown) may be optionally formed on the whole surface of the substrate 100.

Figure 5A:
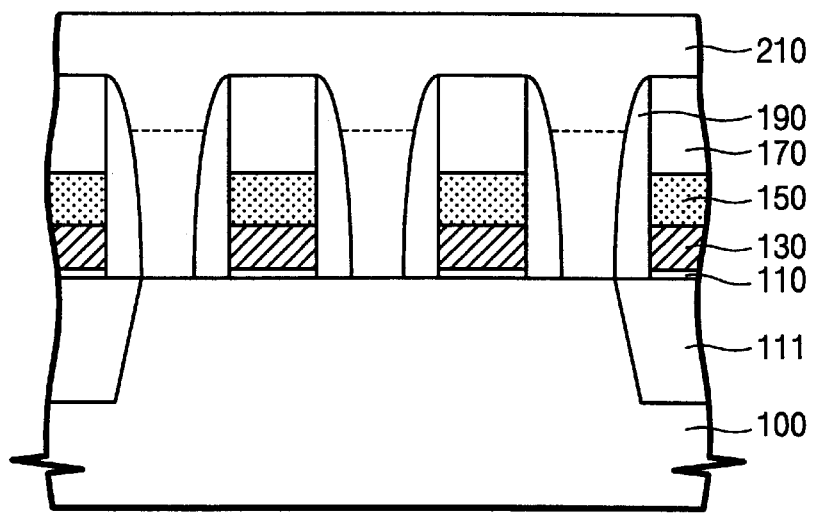
Figure 5B:
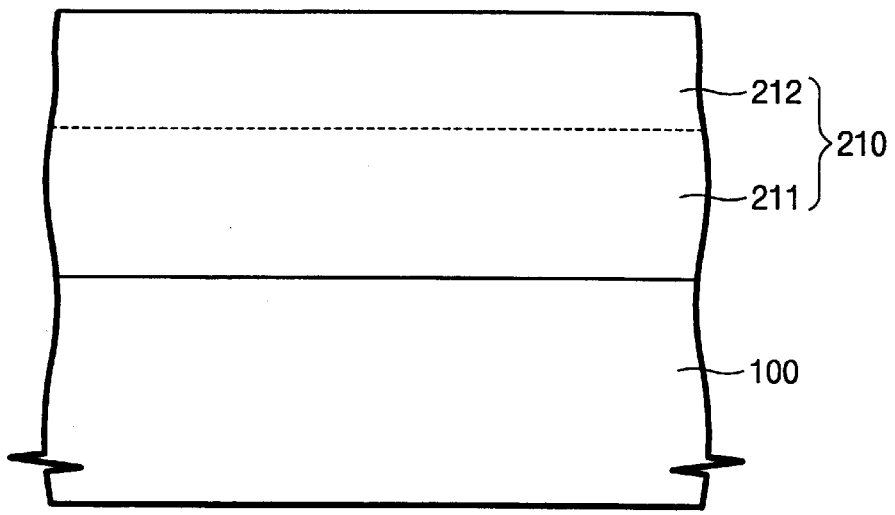

Referring to FIG. 5A and FIG. 5B, to form a SOG layer 210, an organic SOG material, for example, polysilazane, may be applied by means of a spin coating method to the whole surface of the substrate 100 on which the spacers are formed on the sidewalls of the gate lines. Alternatively, an inorganic SOG material, for example, hydro silsesquioxane (HSQ) can be used instead of polysilazane. To obtain a finished SOG insulating layer from the polysilazane layer, a hard bake process that removes solvent ingredients may be performed at a temperature of about 400° C. for several minutes. A curing process may be performed that removes hydrogen and nitrogen ingredients from the polysilazane layer by annealing at a temperature of from about 350° C. to about 850° C. Typically, the polysilazane is annealed at a temperature from about 700° C. to about 800° C. The curing process is performed from about 10 minutes to about 2 hours so that the polysilazane layer forms silicon-oxygen structures crystallized by saturation of oxygen. As a result, a plane SOG insulating layer without voids or seams may be obtained. Alternatively, a planarization process, such as a chemical-mechanical polishing (CMP) process, can additionally be performed.

In a highly integrated circuit device such as a Dynamic Random Access Memory (DRAM) gaps between the gate lines are typically very narrow, thus, it may be difficult to remove impurities, such as hydrogen and nitrogen, in the lower portions and/or corner gaps during the curing process after filling the gaps with the SOG layer 210. Since the curing process begins from the surface of the SOG layer 210, an upper cured layer 212 having hard crystallized structures is formed at the upper part of the SOG layer 210. Therefore, it is difficult for the impurity ingredients below the cured layer 212 to be removed therethrough. Particularly, the impurity ingredients are apt to remain in lower portions and/or corners of the SOG layer 210. Accordingly, at the lower part of the SOG layer 210, for example a portion below the dotted line in FIGS. 5A and 5B in which the impurities remain, a porous layer 211 having minute gaps in silicon dioxide crystallized structures is formed. The lower porous layer 211 of the SOG layer 210 typically has a very high wet etch rate, thus, it is easily etched by means of a very small amount of etchant in a cleaning process.

Figure 6A:
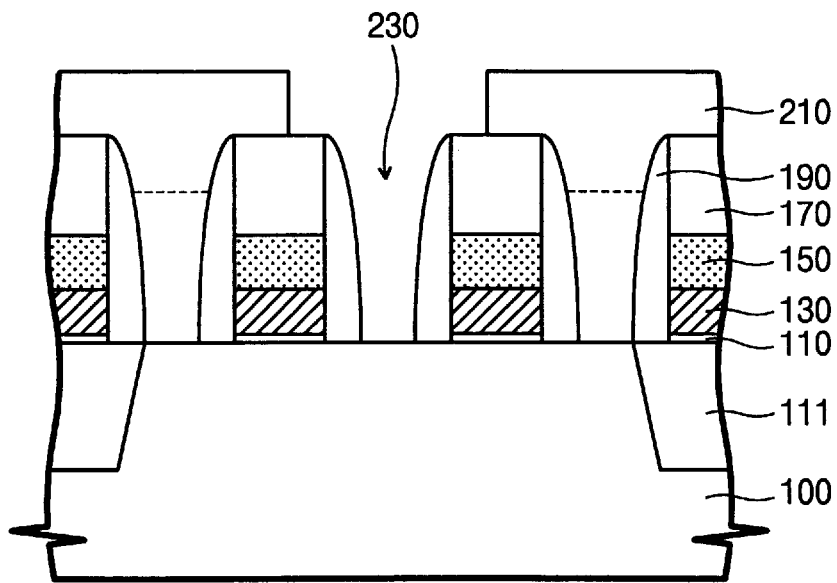
Figure 6B:
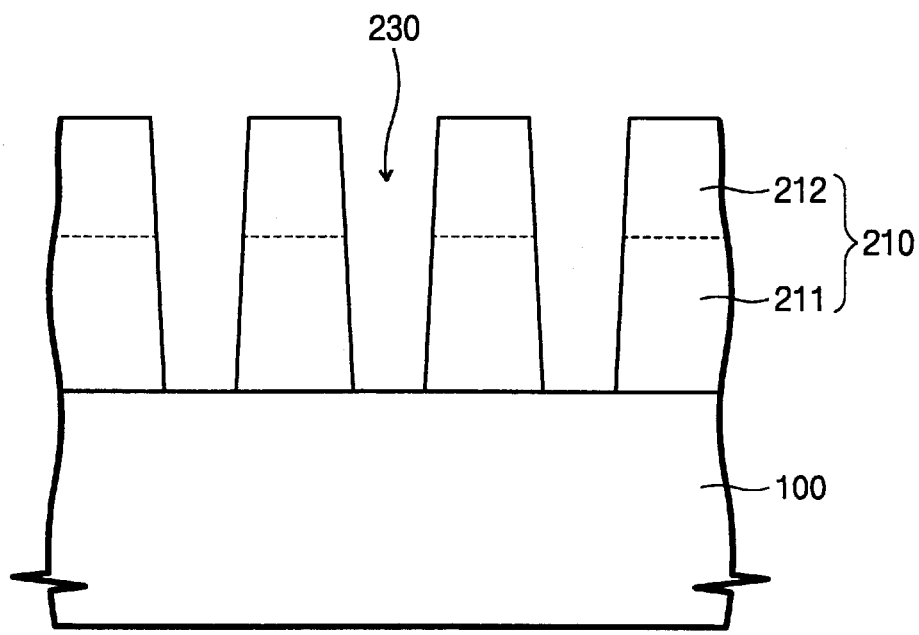

Referring to FIG. 6A and FIG. 6B, contact holes 230 are formed to form self-aligned contacts (SAC). The contact holes 230 may be formed by a method of forming a photoresist pattern on the substrate and then dry-etching the SOG layer 210 by using the photoresist pattern as a mask. At this time, upper portions of the contact holes 230 are formed to have wide widths, but lower portions of the contact holes 230 are formed to expose only narrow gaps between the gate lines since the silicon nitride capping layer 170 and the spacer 190 covering the gate lines act as an etch mask. A portion of sidewalls of each contact hole 230 is composed of the adjacent spacers 190 forming the gate line, whereas the other portion of sidewalls of each contact hole 230 is composed of the SOG layer 210. Thus, the lower porous layer 211 of the SOG layer 210 forming the other portion of the sidewalls of each contact hole 230 is exposed. However, at this time, the sidewalls of the contact holes 230 in the lower porous layer 211 of the SOG layer 210 is not damaged by wet etching or cleaning and remains as it is since only the dry etching process is typically performed to form the contact holes 230.

Figure 7A:
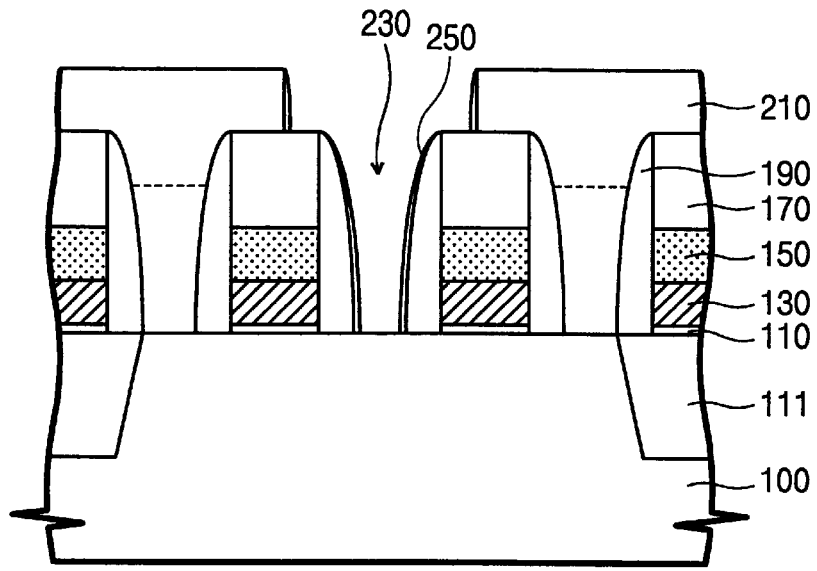
Figure 7B:
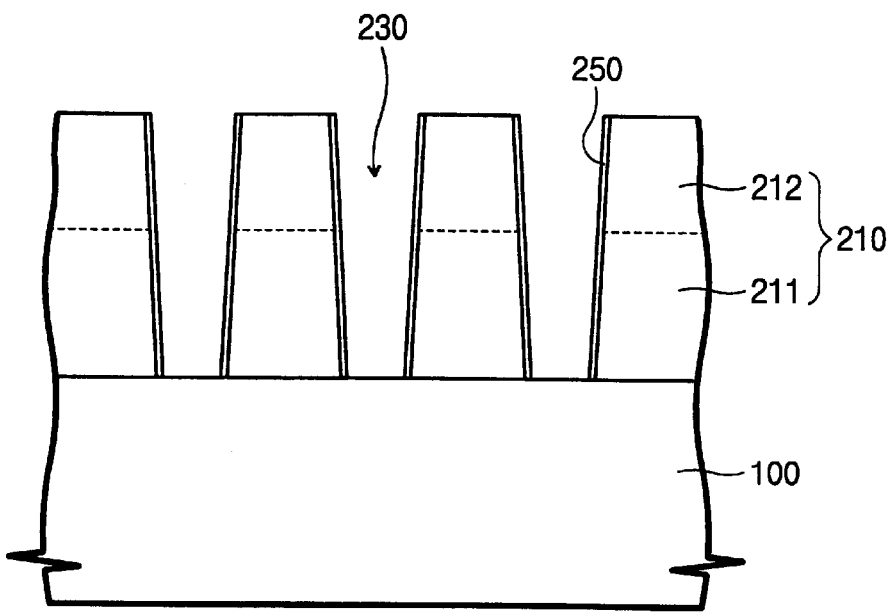

Referring to FIG. 7A and FIG. 7B, a silicon nitride liner layer is formed and has a thickness of from about 50 Å to about 400 Å. Typically, the silicon nitride liner layer has a thickness of from about 100 Å to about 200 Å on the whole surface of the substrate on which the contact holes are formed. An anisotropic etching process may be performed to form hole spacers 250 on sidewalls of the contact holes 230. It is preferable that the hole spacers 250 are formed of a layer of materials, for example, high temperature oxide (HTO), medium temperature oxide (MTO), and silicon nitride ($Si_xN_y$), which provide good step coverage and a small wet etch rate.

A wet etching or cleaning process is performed on the whole surface over which the hole spacers 250 are formed in the contact holes 230. The wet cleaning process is performed for about 10 minutes using a mixture of $NH_4OH$, $H_2O_2$, and de-ionized water called SC1, as a etchant. The purpose of the cleaning process is mainly to remove native oxides formed on the silicon surface of the substrate as well as to remove contaminants such as particles remaining in the contact holes 230. Thus, the cleaning process typically is performed enough to expose the conductive regions of the silicon substrate 100 completely. During the cleaning process, the lower porous layer 211 of the SOG layer 210 forming a portion of the sidewalls of the contact holes 230 is protected by the hole spacers 250, so that a problem such as forming uneven surface or cracks in the contact holes 230 by means of etching can be improved.

Figure 8A:
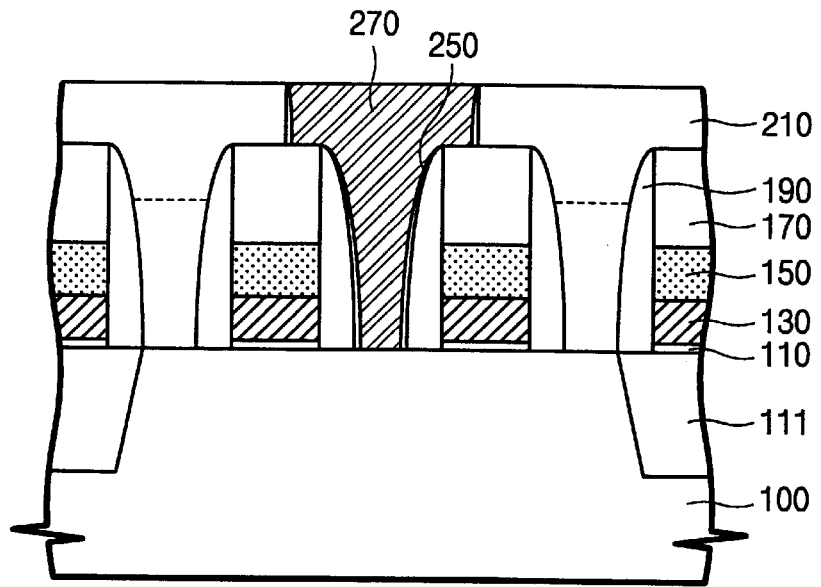
Figure 8B:
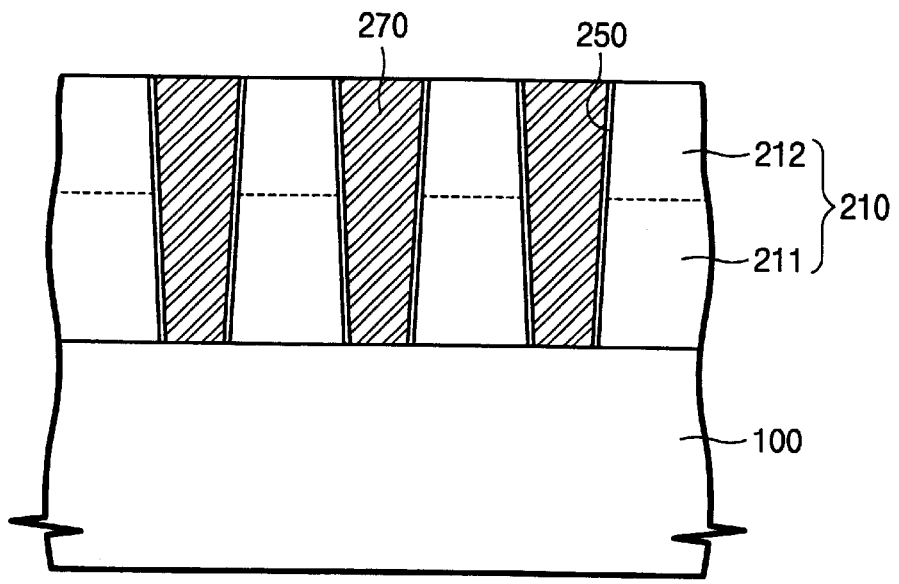

Referring to FIG. 8A and FIG. 8B, the contact holes 230 in which the hole spacers 250 are formed are filled with a polysilicon conducting layer. The polysilicon conducting layer may be formed by a chemical vapor deposition (CVD) process under the conditions that impurities are implanted therein to increase conductivity. A CMP process may be performed to expose the upper surface of the SOG layer 210 and thereby to separate pads 270 from one another. Thus, since there are no portions of the polysilicon conducting layer remaining on the upper surface of the SOG layer 210 between the pads 270, bridges between the pads 270 do not occur.

As discussed above, the present invention provides integrated circuit devices having spin on glass (SOG) insulating layers and methods of fabricating the same. A SOG layer is used as an insulating layer and has sidewalls that define contact holes in the SOG layer. Spacers are provided on the sidewalls of the SOG insulating layer, and thus, short circuits between the pads may occur less frequently when they are formed in the SOG insulating layer which is apt to have a porous crystallized structure portion. Accordingly, the reliability of the device may be increased and the number of devices of inferior quality may be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of fabricating an integrated circuit device, comprising:
    forming a gate line on an integrated circuit substrate, the gate line having gate line sidewalls;
    forming gate line spacers on the gate line sidewalls;
    forming a spin on glass (SOG) insulating layer on the integrated circuit substrate, the SOG insulating layer including SOG sidewalls that define contact holes therein; and
    forming SOG spacers on the SOG sidewalls of the SOG insulating layer such that the SOG spacers extend on a surface of the gate line spacers and contact the integrated circuit substrate.

2. The method of claim 1, wherein forming a SOG insulating layer comprises:
    spin coating a SOG material on the surface of the substrate;
    baking the SOG material; and
    annealing the SOG material.

3. The method of claim 2, wherein the SOG material comprises at least one of polysilazane and silsesquioxane.

4. The method of claim 2, wherein baking the SOG material comprises baking the SOG material at a temperature of about 400° C. for several minutes.

5. The method of claim 2, wherein annealing the SOG material comprises annealing the SOG material at a temperature of from about 350° C. to about 850° C. for from about 10 minutes to about 2 hours.

6. The method of claim 5, wherein annealing the SOG material comprises annealing the SOG material at a temperature of from about 700° C. to about 800° C.

7. The method of claim 1, wherein the following is performed between forming the SOG insulating layer and forming the spacers:
    forming a photoresist pattern on the integrated circuit substrate; and
    dry-etching the SOG layer using the photoresist pattern as a mask.

8. The method of claim 1, wherein forming spacers on sidewalls of the SOG insulating layer comprises:
    forming a spacer layer on the surface of the integrated circuit substrate; and
    etching the spacer layer to form the spacers on the sidewalls of the contact holes.

9. The method of claim 8, wherein the spacer layer comprises at least one of a high temperature oxide (HTO), a medium temperature oxide (MTO) and a silicon nitride ($Si_xN_y$).

10. The method of claim 8, wherein the spacer layer has a thickness of from about 50 Å to about 400 Å.

11. The method of claim 10, wherein the spacer layer has a thickness of from about 100 Å to about 200 Å.

12. The method of claim 1, further comprising:
    cleaning the integrated circuit substrate; and
    depositing a conductive material in the contact holes to form a conductive layer.

13. A method of fabricating an integrated circuit device, comprising:
    forming a spin on glass (SOG) insulating layer on an integrated circuit substrate, the SOG insulating layer including sidewalls that define contact holes therein; and
    forming spacers on the sidewalls of the insulating layer;
    cleaning the integrated circuit substrate; and
    depositing a conductive material in the contact holes to form a conductive layer, wherein cleaning the substrate comprises performing a wet etch over the whole surface of the integrated circuit substrate for about 10 minutes.

14. A method of fabricating an integrated circuit device, comprising:
    forming a spin on glass (SOG) insulating layer on an integrated circuit substrate, the SOG insulating layer including sidewalls that define contact holes therein; and
    forming spacers on the sidewalls of the insulating layer;
    cleaning the integrated circuit substrate; and
    depositing a conductive material in the contact holes to form a conductive layer, wherein cleaning the substrate comprises performing a wet etch over the whole surface of the integrated circuit substrate for about 10 minutes and wherein performing the wet etch comprises a wet cleaning process using a mixture of $NH_4OH$, $H_2O_2$ and de-ionized water (SC1).

15. The method of claim 12, wherein depositing a conductive material comprises forming a conductive layer using a CVD process.

16. The method of claim 15, wherein the conductive layer is a polysilicon conductive layer.

17. The method of claim 15, further comprising performing a CMP process to expose an upper surface of the SOG insulating layer.

18. An integrated circuit device comprising:
    an integrated circuit substrate;
    a gate line on the integrated circuit substrate, the gate line having gate line sidewalls;
    gate line spacers on the gate line sidewalls;
    a spin on glass (SOG) insulating layer on the integrated circuit substrate, the SOG insulating layer including sidewalls that define contact holes therein; and
    SOG spacers on the sidewalls of the SOG insulating layer such that the SOG spacers extend on a surface of the gate line spacers and contact the integrated circuit substrate.

19. A method for interlayer connection comprising the steps of:
    forming a SOG insulating layer on a substrate having a plurality of conductive regions;
    forming holes to expose at least a portion of each of said conductive regions by patterning said SOG insulating layer;
    forming a liner layer on said SOG insulating layer in which said holes are formed;

forming spacers on sidewalls of said holes by performing an etch back of the liner layer;

cleaning the whole surface of said substrate on which said spacers are formed; and filling said holes with a conductive layer.

20. The method of claim 12, wherein cleaning the substrate comprises performing a wet etch over the whole surface of the integrated circuit substrate for about 10 minutes.

21. The method of claim 20, wherein performing the wet etch comprises a wet cleaning process using a mixture of $NH_4OH$, $H_2O_2$ and de-ionized water (SC1).

22. The method of claim 1, wherein the SOG spacers extend on an entire surface of the gate line spacers and contact the integrated circuit substrate.

23. A method of fabricating an integrated circuit device, comprising:

forming a spin on glass (SOG) insulating layer on an integrated circuit substrate;

etching through the SOG insulating layer to form contact holes therein and expose a portion of the integrated circuit substrate; and forming SOG spacers on sidewalls of the contact holes, at least a portion of the SOG spacers contacting the integrated circuit substrate.

24. The method of claim 23 wherein forming the SOG insulating layer is preceded by:

forming a gate line on an integrated circuit substrate, the gate line having gate line sidewalls; and forming gate line spacers on the gate line sidewalls, wherein forming the SOG spacers further comprises forming the SOG spacers extending on the surface of the gate line spacers.

25. The method of claim 24 wherein forming the SOG spacers further comprises forming the SOG spacers extending on an entire surface of the gate line spacers.

* * * * *

UNITED STATES PATENT AND TRADEMARK OFFICE
CERTIFICATE OF CORRECTION

PATENT NO.    : 6,649,503 B2
DATED         : November 18, 2003
INVENTOR(S)   : Kim et al.

It is certified that error appears in the above-identified patent and that said Letters Patent is hereby corrected as shown below:

Column 9,
Line 19, should read -- integrated circuit substrate, the integrated circuit substrate having a gate line formed thereon; --

Signed and Sealed this

Sixth Day of April, 2004

JON W. DUDAS
*Acting Director of the United States Patent and Trademark Office*